United States Patent [19]

Thalmann

[11] Patent Number: 4,591,712
[45] Date of Patent: May 27, 1986

[54] PHOTOELECTRIC FIBER OPTIC SENSING APPARATUS WITH ILLUMINATED ACTUATOR

[75] Inventor: René A. Thalmann, Starrkirch-Wil, Switzerland

[73] Assignee: Elektro-Apparatebau Olten AG, Olten, Switzerland

[21] Appl. No.: 473,733

[22] Filed: Mar. 9, 1983

[30] Foreign Application Priority Data

Mar. 29, 1982 [CH] Switzerland .................. 1908/82

[51] Int. Cl.$^4$ ............................................. H01J 5/16
[52] U.S. Cl. ................................... 250/227; 250/229; 340/365 P
[58] Field of Search ............................ 250/227, 229; 340/365 P; 350/96.1, 96.11, 96.13, 96.2

[56] References Cited

U.S. PATENT DOCUMENTS 3,831,137  8/1974  Cuomo .................... 340/8 R
3,856,127 12/1974  Halfon et al. ............. 197/98
4,013,342  3/1977  Narodny .................. 350/96 C
4,315,147  2/1982  Harmer ................... 250/227

Primary Examiner—David C. Nelms
Assistant Examiner—James Gatto
Attorney, Agent, or Firm—Peter K. Kontler

[57] ABSTRACT

A sensing apparatus wherein a photoelectronic transducer and a light-emitting diode are adjacent to one end face of a bundle of fiber optics. The other end face of the bundle is located in the housing of an actuator wherein a reciprocable plunger can move a light absorbing or light reflecting element into and from the path of light issuing from the bundle. The position of such element influences the amount of light which is reflected back into the conductor to ensure that the signal which is generated by the transducer is indicative of the amount of reflected light. The transducer can transmit signals to a signal receiving device which, in turn, can influence the intensity of light issuing from the diode in dependency upon whether or not the device receives a signal from the transducer. The actuator can be installed in an area which is not explosion-proof or in an area which is exposed to pronounced electrical noise.

11 Claims, 5 Drawing Figures

PHOTOELECTRIC FIBER OPTIC SENSING APPARATUS WITH ILLUMINATED ACTUATOR

BACKGROUND OF THE INVENTION

The present invention relates to sensing or scanning apparatus in general, and more particularly to improvements in scanning or sensing apparatus of the type wherein one or more conductors transmit signals from a target or object to be detected to a remote receiver.

In presently known scanning or sensing apparatus of such character (hereinafter called sensing apparatus for short), the conductor which connects a remote target or object to be detected with a receiver is a copper wire. The target can be moved to and from a detectable position by a pushbutton or key which is mounted in a control panel or the like. A drawback of conventional sensing apparatus is that the fields of their application are limited. For example, such apparatus cannot be used in areas of pronounced electrical noise and/or in areas which are not explosion-proof. Thus, if the target is located in a region of pronounced electrical noise, the conductor is likely to transmit signals at a time when the target is or should not be detected. Furthermore, electrical conductors are likely to cause explosions as a result of spark generation at the locus where the target is to be moved into or from view by a pushbutton or the like.

OBJECTS AND SUMMARY OF THE INVENTION

An object of the invention is to provide a sensing apparatus which is less likely to transmit false signals than a conventional sensing apparatus employing electrical conductor means.

Another object of the invention is to provide a sensing apparatus which is explosion-proof and hence more versatile than conventional apparatus which employ current-carrying conductor means.

A further object of the invention is to provide a simple and inexpensive sensing apparatus whose useful life is surprisingly long, whose versatility exceeds that of apparatus with current-carrying conductors, and which can be used to accept and transmit a wide variety of signals.

Another object of the invention is to provide a novel and improved method of transmitting signals from areas with pronounced electrical noise and/or from areas wherein the danger of explosion is too high to allow for the transmission of electric signals.

Still another object of the invention is to provide the apparatus with novel and improved means for moving the target between a plurality of different positions.

An additional object of the invention is to provide an apparatus which can transmit signals along very short or along relatively long paths and which is capable of reacting, without delay, to the command for transmission of a signal to one or more receivers.

The invention is embodied in a sensing apparatus which comprises an elongated fiber optic conductor (e.g., a bundle of optic fibers) having first and second end faces, a light emitting diode or another suitable source of light which is preferably adjacent to the first end face of the conductor and serves to direct into the conductor light which then issues from the second end face, an actuator including modulating means (such modulating means can include a reflector or a light absorbing device) for effecting the reflection of varying amounts of light issuing from the second end face back into the conductor wherein the reflected light is propagated back to the first end face, light-sensitive transducer means (e.g., a photoelectronic transducer) disposed in the path of reflected light issuing from the first end face of the conductor and serving to transmit a signal whose characteristics are a function of the amount of reflected light, and an amplifier, a logic circuit or analogous means for receiving signals from the transducer means. The transducer means is preferably adjacent to the light source and to the first end face of the conductor.

The actuator further comprises means for moving the light modulating means between a plurality of positions in one of which the modulating means effects the reflection of a first amount of light and in another of which the modulating means effects the reflection of a lesser second amount of light into the second end face of the conductor. The moving means can comprise a reciprocable plunger or an analogous member which is movable in the housing of the actuator between first and second positions, and a cam-follower arrangement for moving the modulating means between the one and the other position in response to movement of the plunger between its first and second positions.

The sensing apparatus can further comprise means for influencing the light source in response to transmission of a signal from the transducer means to the signal receiving means, e.g., to increase or reduce the intensity of light which is emitted by such source when the signal receiving means receives a signal from the transducer means.

The sensing apparatus can further comprise an explosion-proof barrier between the transducer means and the actuator. The conductor then extends through such barrier to transmit light signals from a location (accommodating the actuator) where an explosion could develop in response to the generation of a spark to a location (accommodating the transducer means and the signal receiving means) where an explosion is unlikely so that the transducer means can safely transmit electric signals.

The novel features which are considered as characteristic of the invention are set forth in particular in the appended claims. The improved sensing apparatus itself, however, both as to its construction and its mode of operation, together with additional features and advantages thereof, will be best understood upon perusal of the following detailed description of certain specific embodiments with reference to the accompanying drawing.

DESCRIPTION OF THE PREFERRED EMBODIMENTS

Figure 1:
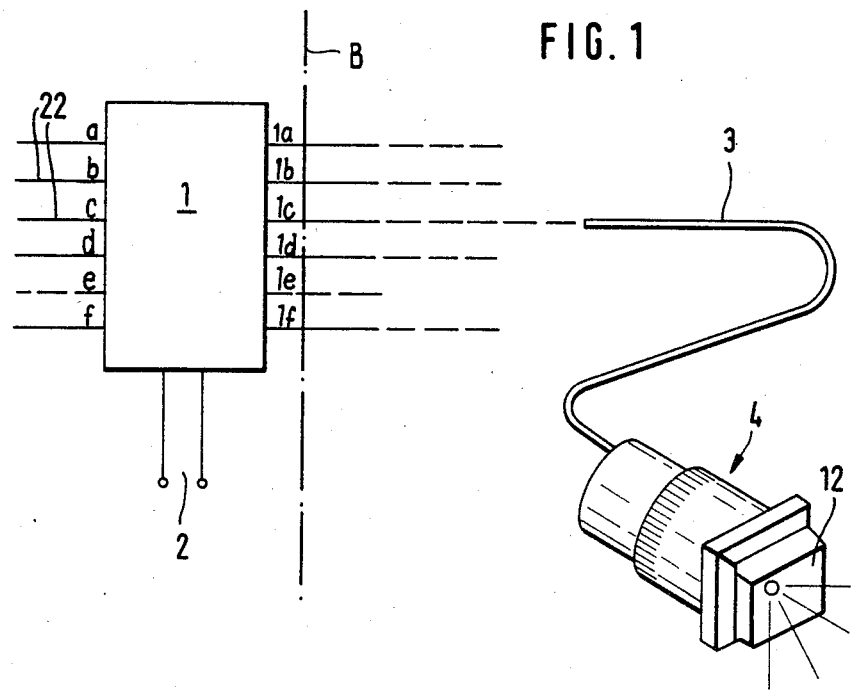
FIG. 1 is a diagrammatic view of a composite sensing apparatus with a battery of transducer means and a discrete actuator for each transducer means, only one such actuator being shown.
Figure 2:
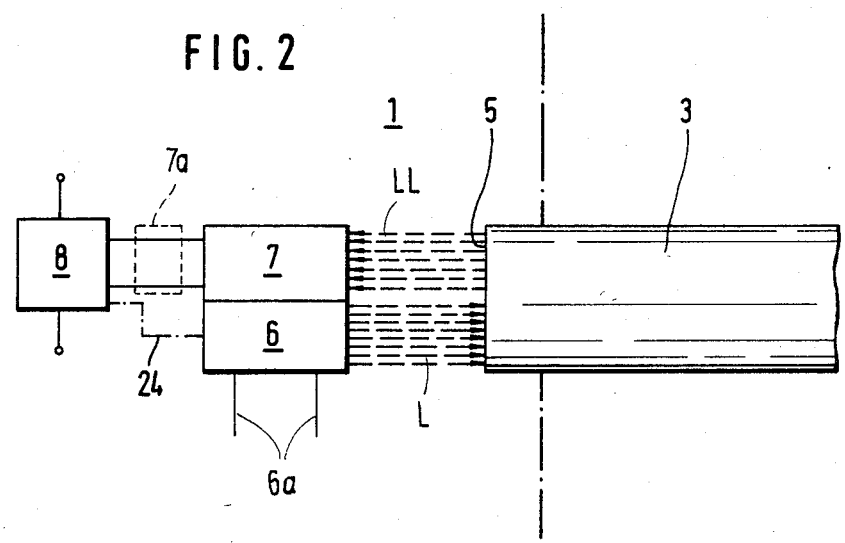
FIG. 2 is an enlarged view of a detail in the composite sensing apparatus of FIG. 1, showing a transducer means, the associated light source, the signal receiving means, and the adjacent end portion of the corresponding conductor.

FIG. 1 shows schematically a composite sensing apparatus which comprises a central unit 1 including several assemblies or groups of parts of the type shown in FIG. 2 and being connected with a source 2 of electrical energy. Furthermore, the central unit 1 is connected with one end portion of each of several conductors in the form of fiber optics bundles 3, and the other end portion of each conductor or bundle 3 is connected with an actuator or initiator 4 which is or which can be remote from the central unit 1 and includes means for moving a light modulating element into and from the path of light which issues from the respective bundle 3. The actuator 4 is assumed to be installed in an area which is not explosion-proof, and such area is separated from the central unit 1 by a barrier which is denoted schematically by a phantom line B. The central unit 1 comprises several outputs a, b, c, d, e and f which are connected with discrete current-carrying conductors 22.

Each of the several groups of parts in the central unit 1 comprises a light source 6 (e.g., a light-emitting diode) which is connected with the energy source 2 by conductor means 6a and directs light L into the adjacent end face 5 of the corresponding bundle 3. The central unit 1 has several sockets 1a, 1b, 1c, 1d, 1e and 1f each of which can receive one end portion of a discrete bundle 3. The group of FIG. 2 further includes a photoelectronic transducer 7, e.g., a photodiode, which is located in the path of light LL issuing from the end face 5 of the respective bundle 3. The electric signal which is generated by the transducer 7 is transmitted to an associated signal receiving device 8, e.g., by way of an electromagnet 7a. The device 8 transmits electric signals to the corresponding output of the central unit 1. The arrangement may be such that a single light source 6 can direct light L into two or more bundles 3.

The intensity of reflected light LL depends on the extent to which the light L is reflected in the corresponding actuator 4, and this in turn determines whether or not the corresponding signal receiving device 8 causes the associated current-carrying conductor 22 to transmit an electric signal. Alternatively, the signal from the output of the transducer 7 can actuate the triac of the device 8.

Figure 3:
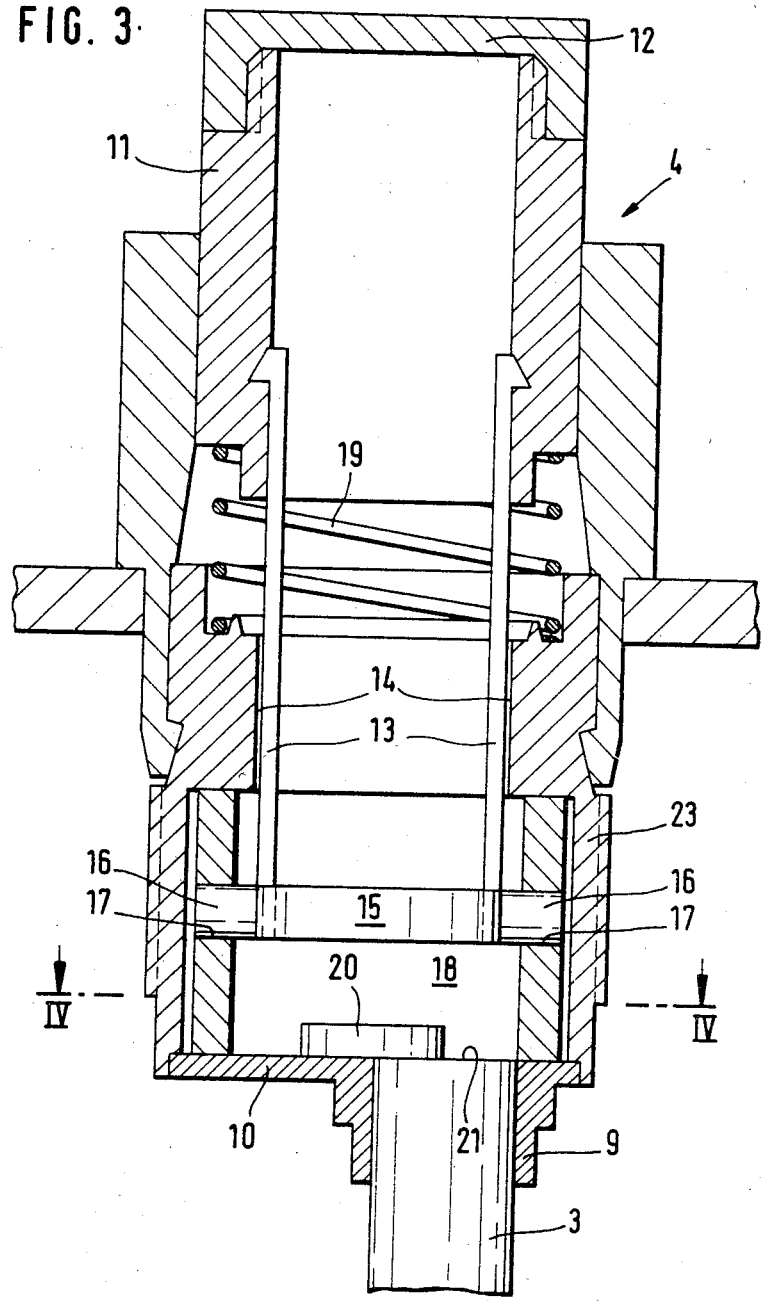
FIG. 3 is an enlarged central sectional view of the actuator which is shown in FIG. 1, further showing the other end portion of the corresponding conductor.

FIG. 3 shows that the other end portion of each bundle 3 is installed in a sleeve or socket 9 at the rear or inner end of the composite housing 23 of the actuator 4. The housing 23 receives and guides a portion of a depressible moving means or plunger 11 having an opaque or light-transmitting cap or lid 12, depending upon whether or not the actuator 4 is supposed to signal the extended (first) or depressed (second) position of the plunger 11.

Figure 5:
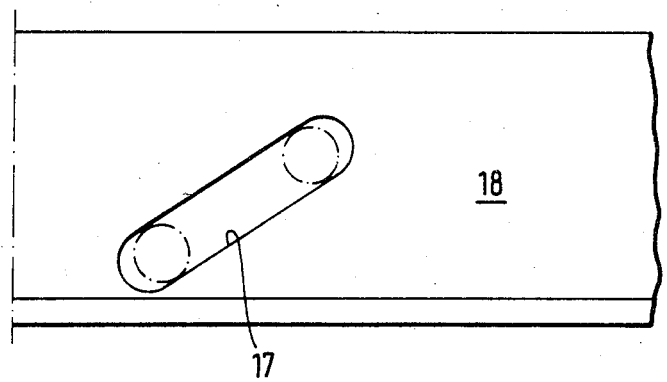
FIG. 5 is a fragmentary developed view of a component of the actuator which is shown in FIG. 3.

The plunger 11 is rigidly connected with two elongated springy elements 13 which are guided in axially parallel internal grooves 14 of the composite housing 23. Those end portions of the springy elements 13 which are remote from the plunger 11 are rigidly connected with a ring-shaped torque-transmitting wiper 15 having two radially outwardly extending protuberances or lobes 16 which are preferably disposed diametrically opposite one another and extend into helical cam grooves 17 machined in a sleeve-like rotary follower 18 installed in the housing 23 adjacent to an end wall or bottom wall 10 which is rigid or integral with the socket 9. FIG. 5 shows that the illustrated cam groove 17 of the follower 18 extends along an arc of approximately 90° so that the angular position of the follower 18 is changed by 90° in response to depression of the plunger 11 from the illustrated extended or first position to a second position in which the plunger stresses a coil spring 19 in the housing 23. When the pressure upon the cap 12 is relaxed, the spring 19 expands and returns the plunger 11 to the illustrated extended position whereby the plunger 11 rotates the ring-shaped follower 18 in the opposite direction so that the lobes 16 travel from the lower to the upper ends of the respective cam grooves 17.

Figure 4:
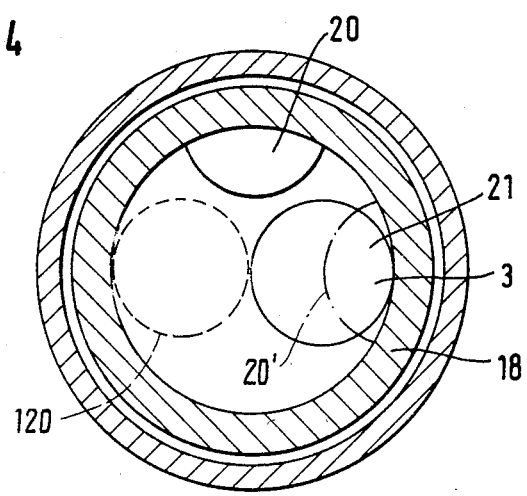
FIG. 4 is a sectional view as seen in the direction of arrows from the line IV—IV of FIG. 3.

The follower 18 rotates relative to the bottom wall 10 and carries a light modulating element 20 which moves with reference to the adjacent end face 21 of the corresponding bundle 3 in response to rotation of the follower 18 in either direction. FIG. 4 shows that the modulating element 20 can constitute or resemble one-half of a circular plate which is movable between the solid-line and phantom-line positions. When in the phantom-line position 20', the element 20 overlies a certain portion of the end face 21 of the bundle 3.

When the element 20 assumes the position 20', it changes the ratio of reflected light, i.e., it changes the amount of light LL which impinges upon the transducer 7 whereby the latter transmits a signal to the signal receiving device 8. Light which bypasses the element 20 impinges upon and passes through the lid 12 if the latter consists of a light-transmitting material so that each change in intensity of light issuing from the lid 12 denotes a change in the position of the plunger 11. The intensity of light passing through the lid 12 (note FIG. 1) is more pronounced when the plunger 11 is held in the extended position under the action of the return spring 19, and such intensity is less pronounced when the plunger 11 is held in the depressed position because the modulating element 20 then overlies a part of the end face 21 of the bundle 3.

The dimensions and mounting of the light modulating element 20 can be varied in a number of ways without departing from the spirit of the invention. For example, the element 20 can be replaced with a modulating element 120 having a circular outline and a diameter matching or approximating that of the end face 21. The element 120 is mounted diametrically opposite the end face 21, as viewed in FIG. 4 (see the broken-line circle) and the configuration of cam grooves 17 in the ring 18 is then altered in such a way that each movement of the plunger 11 from its fully extended to its fully depressed position entails an angular movement of the follower 18 through 180° so that the modulating element 120 fully overlies the end face 21 when the plunger is held in the depressed position. The diameters of the end face 21 and element 120 can equal half the inner diameter of the follower 18.

It is equally possible to replace the helical grooves 17 with heart-shaped grooves wherein the lobes 16 of the wiper 15 are guided in such a way that a first depression of the plunger 11 results in retention of the plunger in or close to the fully depressed position and a renewed application of pressure to the depressed plunger allows for an upward movement of the plunger under the action of the return spring 19. Such modes of ensuring retention of a plunger in depressed position are known in the art. Selection of the exact manner in which the means for guiding and retaining (if necessary) the plunger 11 in the depressed position will depend on the desired duration of signals which the transducer 7 must transmit in response to depression of the plunger. Thus, if the transmission of a signal should continue, the actuator 4 will be provided with means for releasably holding the depressed plunger 11 in depressed position until the operator or a remote control device allows the plunger to return to its extended position under the action of the spring 19.

FIGS. 3 and 4 show the so-called proximity mode scanning of the modulating element 20 or 120, i.e., the element 20 or 120 is the only object to reflect light (LL) to the transducer 7. However, it is equally possible to resort to the so-called retroreflective mode of scanning according to which a retroreflective target is permanently in the path of light issuing from the end face 21 of the bundle 3 and the modulating element 20 or 120 is introduced into the path of light which travels toward or is reflected by the retroreflective target in response to each depression of the plunger 11. All that counts is to ensure that shifting of the modulating element 20 or 120 from a first to a second position will entail the generation of a signal by the transducer 7 so that such signal can influence the condition of the signal receiving device 8.

FIG. 2 shows a feedback conductor 24 (indicated by a phantom line because it constitutes an optional feature of the sensing apparatus) which connects the signal receiving device 8 with the light-emitting diode 6. If the device 8 transmits a signal in response to reception of a signal from the transducer 7, it also transmits a signal to the diode 6 via conductor 24 whereby the diode intensifies or reduces the emission of light L, e.g., by the simple expedient of increasing or reducing the voltage of electrical energy supplied by the conductors 6a. This enables the actuator 4 to furnish a detectable signal denoting the condition of the signal receiving device 8 because the intensity of light which penetrates through the lid 12 is a function of the condition of the device 8.

An important advantage of the improved sensing apparatus is that the actuator 4 can be installed in areas which are not explosion-proof because depression of the plunger 11 or its return movement to extended position does not entail the generation of sparks and thus the actuator 4 need not be connected to a source of electrical energy. All such parts which require electrical energy are disposed behind the barrier B and are not only unlikely to cause explosions but actually incapable of causing explosions in the area accommodating the actuator 4. Furthermore, the improved sensing apparatus will function in the desired manner even if the actuator 4 is installed or maintained in an area wherein the electrical noise is quite pronounced because such noise cannot influence the transmission of signals from the actuator to the transducer 7.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of my contribution to the art and, therefore, such adaptations should and are intended to be comprehended within the meaning and range of equivalence of the appended claims.

I claim:

1. Sensing apparatus, comprising an elongated fiber optics conductor having first and second end faces; a single light source arranged to direct light into the first end face of the conductor so that the light issues from the second end face; an actuator including a housing, said conductor having an end portion including said second end face and installed in said housing, said actuator further including optomechanical modulating means provided in said housing for effecting the reflection of varying amounts of light issuing from the second end face back into the conductor wherein the reflected light propagates itself back to the first end face and said actuator also including means for moving the modulating means between a plurality of positions in one of which positions the modulating means effects the reflection of a first amount of light and in another of which positions the modulating means effects the reflection of a second amount of light smaller than the first amount into the second end face of the conductor, said housing having a light-transmitting portion located in the path of propagation of light which issues from the second end face of the conductor and is not reflected by said modulating means so that the quantity of light impinging upon said portion of the housing increases when the quantity of reflected light decreases and vice versa; light-sensitive transducer means disposed in the path of reflected light issuing from the first end face of the conductor and arranged to transmit a signal whose characteristics are a function of the amount of reflected light; and means for receiving signals from the transducer means.

2. The sensing apparatus of claim 1, wherein the moving means comprises a member which is reciprocable between first and second positions and means for moving the modulating means between the one and the other position in response to movement of such member between the first and second positions.

3. The sensing apparatus of claim 1, further comprising means for changing the amount of light directed into the first end face of the conductor by the light source in response to transmission of a signal from the transducer means to the signal receiving means.

4. The sensing apparatus of claim 1, wherein the means for moving the modulating means comprises a reciprocable plunger.

5. The sensing apparatus of claim 1, wherein the modulating means includes a reflector.

6. The sensing apparatus of claim 1, wherein the modulating means includes a light absorbing device.

7. The apparatus of claim 1, wherein the light source includes a light-emitting diode.

8. The apparatus of claim 1, wherein the light source and the transducer means are adjacent to the first end face of the conductor.

9. The apparatus of claim 1, wherein the transducer means is designed so that the transmitted signal is an electric signal.

10. The apparatus of claim 1, wherein the conductor comprises a bundle of fiber optics.

11. The apparatus of claim 1, further comprising an explosion-proof barrier separating the actuator from the transducer means, the conductor extending through such barrier.

* * * * *